United States Patent
Luo et al.

(10) Patent No.: US 10,397,142 B2
(45) Date of Patent: Aug. 27, 2019

(54) MULTI-CHIP STRUCTURE HAVING FLEXIBLE INPUT/OUTPUT CHIPS

(71) Applicant: MEDIATEK INC., Hsin-Chu (TW)

(72) Inventors: Yan-Bin Luo, Taipei (TW); Hao-Hui Yin, Hsinchu (TW); Chih-Ching Yu, Hsinchu (TW); Yao-Chun Su, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 25 days.

(21) Appl. No.: 15/050,473

(22) Filed: Feb. 23, 2016

(65) Prior Publication Data

US 2017/0054656 A1  Feb. 23, 2017

Related U.S. Application Data

(60) Provisional application No. 62/205,789, filed on Aug. 17, 2015.

(51) Int. Cl.
| | |
|---|---|
| H03M 9/00 | (2006.01) |
| H04L 12/931 | (2013.01) |
| H04L 12/935 | (2013.01) |
| H01L 25/065 | (2006.01) |
| H01L 25/18 | (2006.01) |

(52) U.S. Cl.
CPC .......... *H04L 49/40* (2013.01); *H01L 25/0655* (2013.01); *H01L 25/18* (2013.01); *H03M 9/00* (2013.01); *H04L 49/30* (2013.01); *H01L 2224/16227* (2013.01); *H01L 2224/16235* (2013.01); *H01L 2924/15192* (2013.01); *H01L 2924/15311* (2013.01)

(58) Field of Classification Search
CPC .......... H03M 9/00; H04L 49/40; H04L 49/30; H01L 25/0655; H01L 25/18; H01L 2924/15192; H01L 2224/16235; H01L 2924/15311; H01L 2224/16227
USPC .......................................................... 341/100
See application file for complete search history.

(56) References Cited

U.S. PATENT DOCUMENTS

| | | | | |
|---|---|---|---|---|
| 6,628,679 B1 * | 9/2003 | Talarek | ................... | H04J 3/047 370/536 |
| 6,821,029 B1 * | 11/2004 | Grung | ..................... | G02B 6/43 385/88 |
| 7,010,612 B1 | 3/2006 | Si | | |
| 7,376,767 B1 * | 5/2008 | Black | ....................... | G06F 5/06 370/466 |

(Continued)

FOREIGN PATENT DOCUMENTS

CN   203984453 U   12/2014

OTHER PUBLICATIONS

Lattice Semiconductor, "High-Speed SERDES Interfaces in High Value FPGAs," www.latticesemi.com, Feb. 2009, pp. 1-10 (Year: 2009).*

(Continued)

*Primary Examiner* — Un C Cho
*Assistant Examiner* — Lalita W Pace
(74) *Attorney, Agent, or Firm* — Wolf, Greenfield & Sacks, P.C.

(57) ABSTRACT

A multi-chip structure comprises a switch system on chip (switch SOC), a plurality of serializer/deserializer (SerDes) chips positioned around the switch SOC, and a plurality of inter-chip interfaces for connecting the switch SOC to the plurality of SerDes chips, respectively.

21 Claims, 4 Drawing Sheets

(56) References Cited

U.S. PATENT DOCUMENTS

| | | | | |
|---|---|---|---|---|
| 8,218,537 B1* | 7/2012 | Gui | ............ | H04L 49/00 370/369 |
| 8,576,865 B1* | 11/2013 | Lo | ............ | H04L 49/30 370/419 |
| 8,762,608 B1* | 6/2014 | Longstreet | ............ | G06F 11/273 710/71 |
| 9,515,694 B1* | 12/2016 | Sidiropoulos | ............ | H04B 1/40 |
| 2002/0191620 A1* | 12/2002 | Chen | ............ | H04L 49/30 370/401 |
| 2004/0218597 A1* | 11/2004 | Choi | ............ | H04L 45/742 370/389 |
| 2006/0244482 A1* | 11/2006 | Peterson | ............ | H03K 19/1735 326/38 |
| 2008/0179735 A1 | 7/2008 | Urakawa | | |
| 2012/0300792 A1* | 11/2012 | Patel | ............ | H04L 69/324 370/476 |
| 2014/0186023 A1* | 7/2014 | Louderback | ............ | H04B 10/077 398/16 |
| 2014/0300003 A1 | 10/2014 | Kariyazaki | | |
| 2014/0321804 A1* | 10/2014 | Thacker | ............ | G02B 6/4274 385/14 |
| 2015/0113495 A1* | 4/2015 | Shapiro | ............ | H01L 25/50 716/122 |
| 2016/0013794 A1* | 1/2016 | Su | ............ | H03K 21/00 377/47 |
| 2016/0019174 A1* | 1/2016 | Sreenath | ............ | G06F 13/287 375/219 |

OTHER PUBLICATIONS

Wikipedia, Pulse-amplitude modulation, May 18, 2015, pp. 1-3, https://en.wikipedia.org/w/index.php?title=Pulse-amplitude_modulation&oldid=662931696.

* cited by examiner

US 10,397,142 B2

MULTI-CHIP STRUCTURE HAVING FLEXIBLE INPUT/OUTPUT CHIPS

CROSS REFERENCE TO RELATED APPLICATIONS

This application claims the priority of U.S. Provisional Application No. 62/205,789, filed on Aug. 17, 2015, which is included herein by reference in its entirety.

BACKGROUND

Conventional switch system on chip (switch SOC) generally includes serializer/deserializer (SerDes) circuits to convert serial data to parallel data or to convert parallel data to serial data. In order to satisfy next generation switch SOC, the SerDes circuits need to support multi-standards to meet the system requirement, however, designing multi-standards SerDes circuits within the switch SOC may cause some problems. First, the power dissipation cannot be optimized for every SerDes circuit, and the SerDes circuits may take a lot of overhead to support different standards such as non-return-to-zero (NRZ) standard and pulse-amplitude modulation (PAM) standard at the same circuits. Second, the switch SOC is manufactured by advanced Complementary Metal-Oxide-Semiconductor (CMOS) process that is the best choice for the core circuit, but this advanced CMOS process may not be the best for the high-speed SerDes circuits. In addition, the core circuit of the switch SOC may be manufactured by a low supply voltage process, for example 10 nm process with 0.75V supply voltage, however, some SerDes circuits should be operated in wide dynamic range so that the low supply voltage process is not a good solution.

SUMMARY

It is therefore an objective of the present invention to provide a multi-chip structure, which comprises a switch SOC and a plurality of input/output (IO) chips, and each of the switch SOC and IO chips can be designed to optimize its performance, to solve the above-mentioned problems.

According to one embodiment of the present invention, a multi-chip structure comprises a switch SOC, a plurality of SerDes chips positioned around the switch SOC, and a plurality of inter-chip interfaces for connecting the switch SOC to the plurality of SerDes chips, respectively.

According to another embodiment of the present invention, a multi-chip structure comprises a SOC, at least three SerDes chips positioned at different sides of the switch SOC; and a plurality of inter-chip interfaces, for connecting the switch SOC to the plurality of SerDes chips, respectively.

According to another embodiment of the present invention, a multi-chip structure comprises a SOC, a plurality of IO chips positioned around the SOC, and a plurality of inter-chip interfaces for connecting the SOC to the plurality of IO chips, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
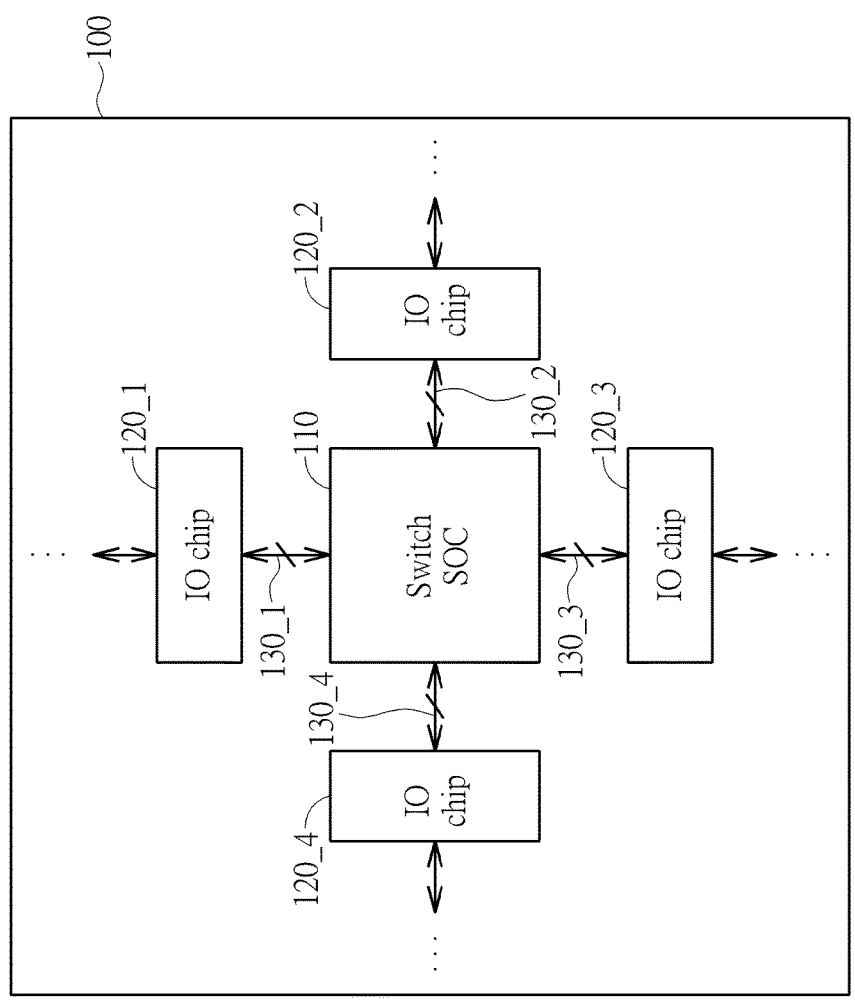
FIG. 1 is a diagram illustrating a package according to one embodiment of the present invention.

Please refer to FIG. 1, which is a diagram illustrating a package 100 according to one embodiment of the present invention. As shown in FIG. 1, the package 100 comprises a switch SOC 110, a plurality of IO chips 120_1-120_4 and a plurality of inter-chip interfaces 130_1-130_4, wherein the IO chips 12_1-120_4 are positioned at four sides of the switch SOC 110, and the IO chips 120_1-120_4 are connected to the switch SOC 110 via the inter-chip interfaces 130_1-130_4, respectively. In this embodiment, the package 100 is used in a physical network switch such as a Top-of-Rack (ToR) switch in a data center.

In this embodiment, each of the IO chips 12_1-120_4 is a SerDes chip, and is configured to convert the serial data to parallel and/or convert the parallel data to serial data. In addition, the IO chips 120_1-120_4 may supports at least two different Ethernet standards, wherein the at least two different Ethernet standards may comprise, without limitation, 100G-base 5R4/CR4/KR4 (25G*4)NRZ, 400G-base 5R16 (25G*16) NRZ, 400G-base LR8/CR8/KR8 (50G*8) NRZ or PAM-4, 400G-base LR4 (100G*4) PAM-4, and 400G-base LR2 (200G*2) PAM-4/PAM-8/PAM-16, . . . and any other suitable modulation standards.

In one embodiment, the IO chips 120_1-120_4 may be manufactured by at least two different semiconductor processes to optimize their performances. For example, one of the IO chips 120_1-120_4 may be manufactured by a low supply voltage process such as 10 nm process with 0.75V supply voltage, while another one of the IO chips 120_1-120_4 may be manufactured by another process having a higher supply voltage.

Figure 2:
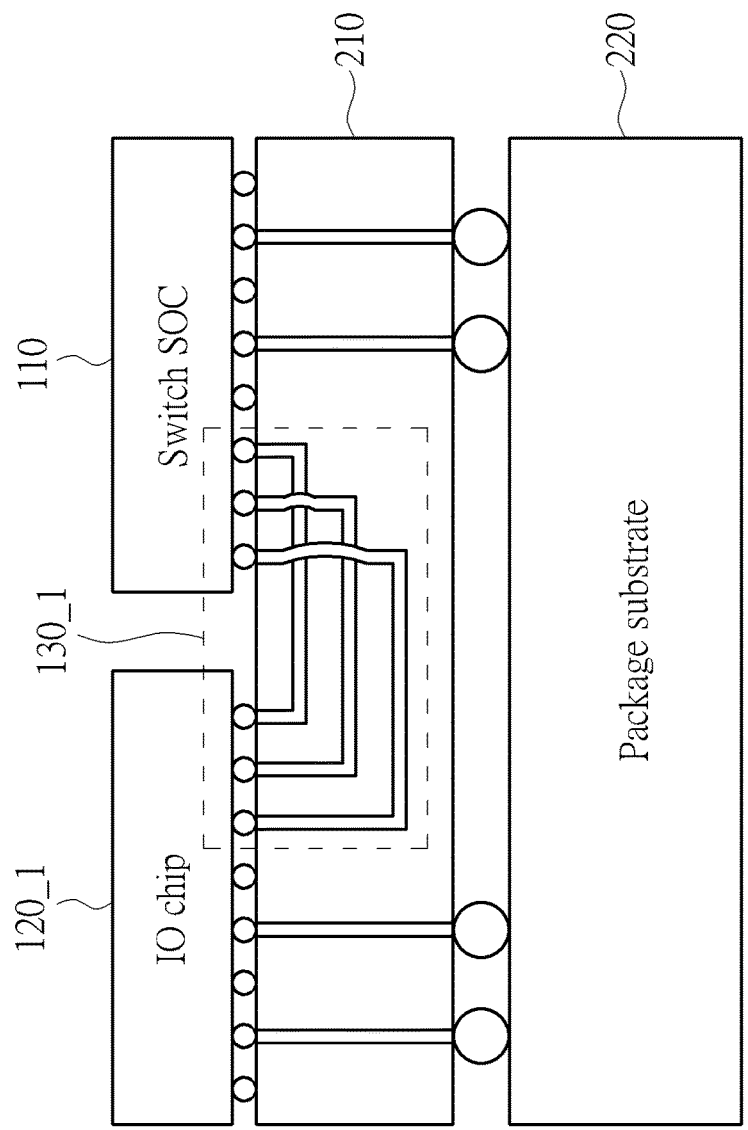
FIG. 2 shows a portion of the package according to one embodiment of the present invention.

FIG. 2 shows a portion of the package 100 according to one embodiment of the present invention. As shown in FIG. 2, the switch SOC 110 and the IO chip 120_1 are bonded on a passive interposer 210, the passive interposer 210 is bonded on a package substrate 220, and the inter-chip interface 130_1 is an electrical routing between the switch SOC 110 and the IO chip 120_1. It is noted that the embodiment shown in FIG. 2 is for illustrative purposes only, the inter-chip interface 130_1 can be formed by another routing type for another package technology.

Figure 3:
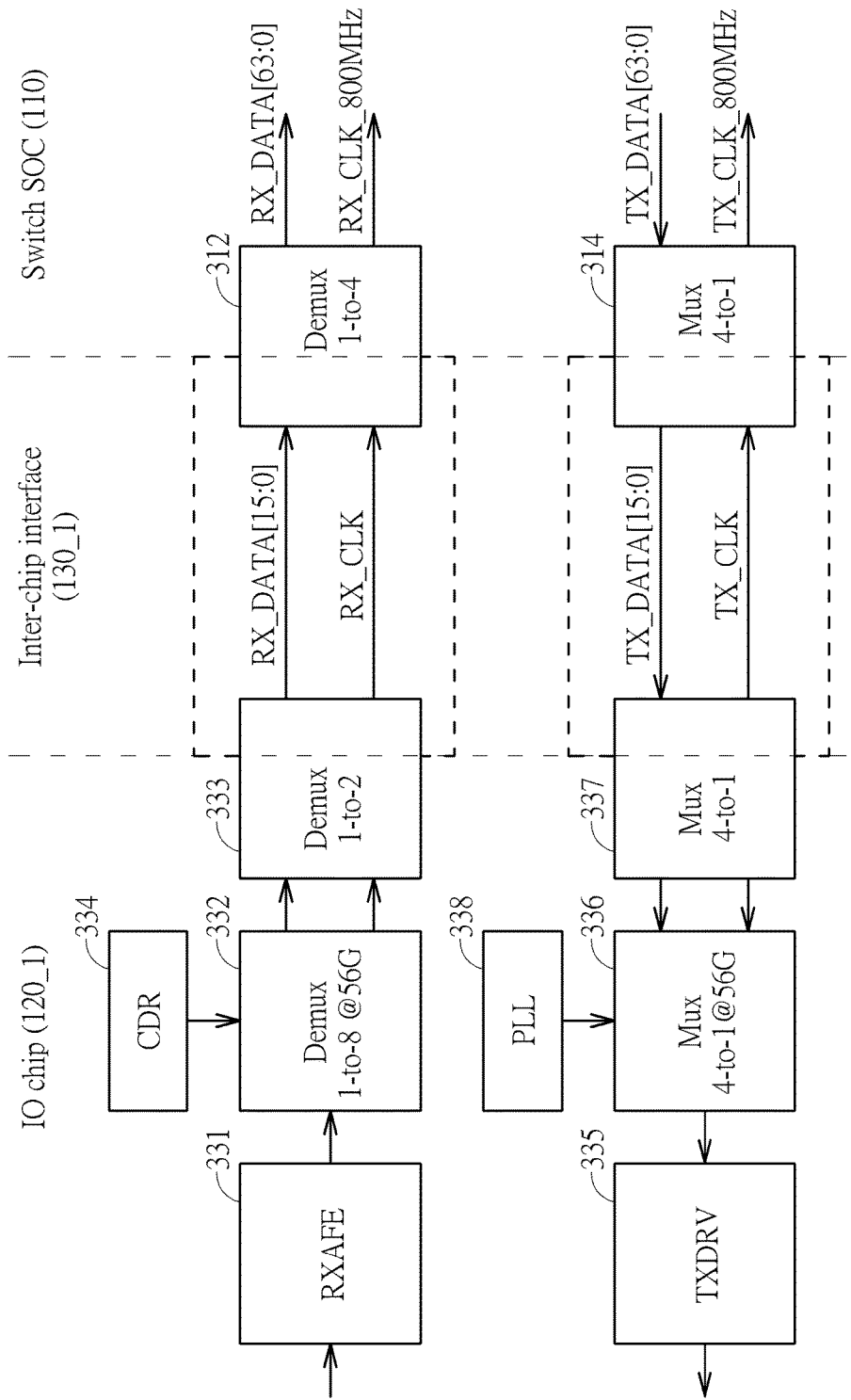
FIG. 3 shows a detailed structure of the switch SOC, the IO chip, and the inter-chip interface shown in FIG. 1 according to one embodiment of the present invention.

FIG. 3 shows a detailed structure of the switch SOC 110, the IO chip 120_1 and the inter-chip interface 130_1 according to one embodiment of the present invention. As shown in FIG. 3, the switch SOC 110 comprises at least a demultiplexer (demux) 312 and a multiplexer (mux) 314, the IO chip 120_1 comprises a receiver analog front end circuit (RXAFE) 331, demultiplexers 332 and 333, a clock and data recovery circuit (CDR) 334, a transmitter driver (TXDRV) 335, multiplexers 336 and 337 and a phase-locked loop (PLL) 338, and the inter-chip interface 130_1 comprises a plurality transmission lines.

In the operations of the circuits shown in FIG. 3, for the upper portion of FIG. 3, the IO chip 120_1 converts the serial data into parallel data, and sends the parallel data to the switch SOC 110 via the inter-chip interface 130_1. In detail, the RXAFE 331 receives the serial data from another chip within or without the package 100, and forwards the received serial data to the demultiplexer 332. The demultiplexer 332 converts the serial data to the parallel data, for example, when the received serial data has a frequency equal to 56 GHz, the demultiplexer 332 may serve as a 1-to-8 demultiplexer. The demultiplexer 333 (1-to-2 demux) further converts each of the received data to the parallel data, that is the demultiplexer 333 outputs sixteen parallel data. Then, the demultiplexer 333 sends the sixteen parallel data RX_DATA [15:0] to the switch SOC 110 via the inter-chip interface 130_1. In addition, the demultiplexer 312 (1-to-4 demux) within the switch SOC 110 further converts the each of the received data to four parallel data, that is the demultiplexer 312 generates sixty-four parallel RX_DATA [63:0] to the core circuit of the switch SOC 110 for further process. Furthermore, the CDR 334 generates at least one clock signal to the demultiplexer 332 according to the received serial data, and the clock signal used by the other demultiplexers may be derived from this clock signal or from other sources. In addition, the clock frequency (e.g. 56 GHz and 800 MHz) and the transmission of the clock signal (e.g. RX_CLK) shown in FIG. 3 is for illustrative purposes only, and are not limitations of the present invention.

For the lower portion of FIG. 3, the IO chip 120_1 receives the parallel from the switch SOC 110, and converts the parallel data into serial data, and sends the serial data to the another chip within or without the package 100. In detail, the multiplexer 314 (4-to-1 mux) receives the parallel data TX_DATA [63:0] and converts the sixty-four parallel data TX_DATA [63:0] to sixteen parallel data TX_DATA [15:0], and sends the parallel data TX_DATA [15:0] to the IO chip 120_1 via the inter-chip interface 130_1.

Then, the multiplexers 337 and 336 (4-to-1 mux) convert the parallel data to the serial data having the frequency equal to 56 GHz, and the TXDRV 335 sends the serial data to another chip within or without the package 100. In addition, the PLL 338 is arranged to provide a clock signal to the multiplexer 336, and the clock signal used by the other multiplexers may be derived from this clock signal or from other sources. In addition, the clock frequency (e.g. 56 GHz and 800 MHz) and the transmission of the clock signal (e.g. TX_CLK) shown in FIG. 3 is for illustrative purposes only, and are not limitations of the present invention.

By using the embodiment shown in FIG. 1, because the IO chips 120_1-120_4 are independent chips capable of serving as flexible IO chips, the IO chips 120_1-120_4 can be designed and manufactured independently to optimize their performance; and when a new product is developed, the IO chips may not need to re-design to save the development cost.

In addition, the quantity of the IO chips and their positions shown in FIG. 1 is for illustrative purposes only, and are not limitations of the present invention. In other embodiments, the package may merely have two or three IO chips around the switch SOC, for example, one or two of the IO chips 120_1-120_4 may be removed from the package 100 shown in FIG. 1, and this alternative design shall fall within the scope of the present invention.

Figure 4:
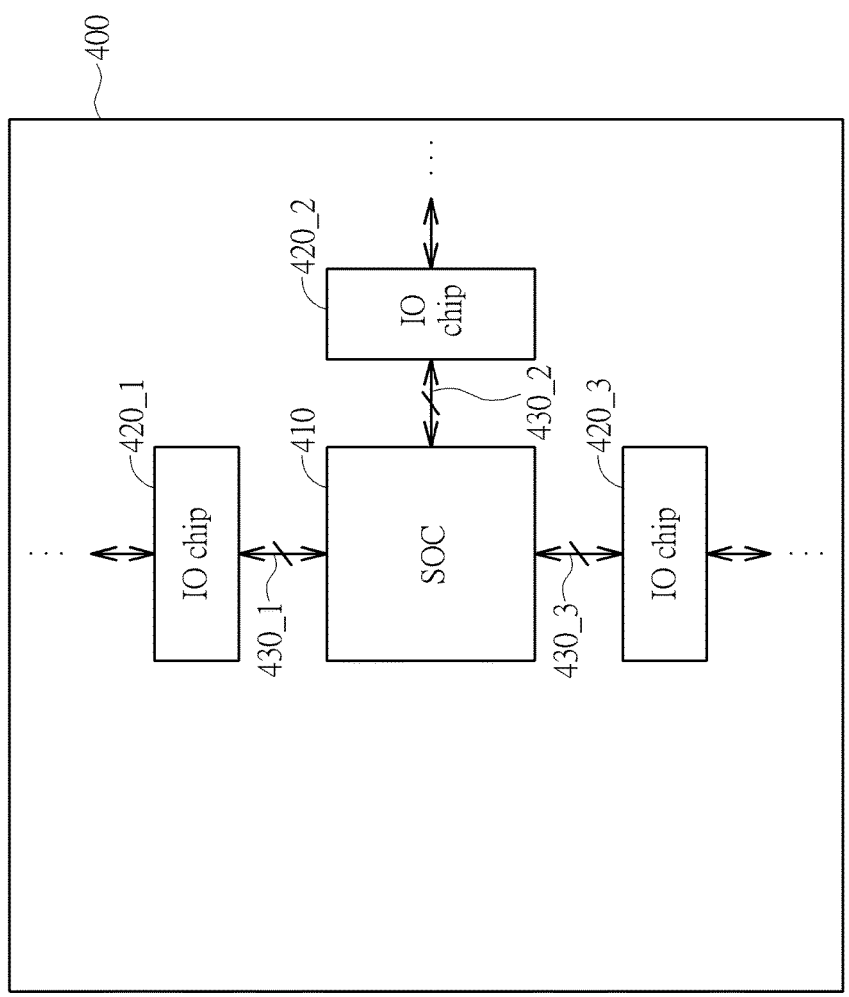
FIG. 4 is a diagram illustrating a package according to one embodiment of the present invention.

Please refer to FIG. 4, which is a diagram illustrating a package 400 according to another embodiment of the present invention. As shown in FIG. 4, the package 400 comprises a switch SOC 410, a plurality of IO chips 420_1-420_3 and a plurality of inter-chip interfaces 430_1-430_3, wherein the IO chips 420_1-42_3 are positioned at three sides of the switch SOC 410, and the IO chips 420_1-420_3 are connected to the switch SOC 410 via the inter-chip interfaces 430_1-430_3, respectively. In this embodiment, the package 400 can be arranged in any electronic device required to process signals with different IO standards, and particularly the package 400 can be used in a physical network switch such as a Top-of-Rack (ToR) switch in a data center.

In this embodiment, each of the IO chips 420_1-420_3 is a SerDes chip, and is configured to convert the serial data to parallel and/or convert the parallel data to serial data. In addition, the IO chips 420_1-420_3 may support at least two different Ethernet standards, wherein the at least two different Ethernet standards may comprise, without limitation, 100G-base SR4/CR4/KR4 (25G*4) NRZ, 400G-base SR16 (25G*16) NRZ, 400G-base LR8/CR8/KR8 (50G*8) NRZ or PAM-4, 400G-base LR4 (100G*4) PAM-4, and 400G-base LR2 (200G*2) PAM-4/PAM-8/PAM-16, . . . and any other suitable modulation standards.

In one embodiment, the IO chips 420_1-420_3 may be manufactured by at least two different semiconductor processes to optimize their performances. For example, one of the IO chips 420_1-420_3 may be manufactured by a low supply voltage process such as 10 nm process with 0.75V supply voltage, while another one of the IO chips 420_1-420_3 may be manufactured by another process having a higher supply voltage.

The package structure and the inner circuit structure of the package 400 may refer to the embodiment shown in FIG. 2 and FIG. 3, respectively.

Briefly summarized, in the multi-chip structure of the present invention, the IO chips are connected to the SOC via the inter-chip interfaces, respectively, and the IO chips and the SOC can be designed and manufactured independently. Therefore, these flexible IO chips can be designed independently to optimize their performance, and can be manufactured by a most suitable semiconductor process. In addition, when a new product is developed, the IO chips may not need to re-design to save the development cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A multi-chip structure, comprising:
a switch system on chip (switch SOC) comprising a core circuit, a first multiplexer, and a first de-multiplexer;
a plurality of serializer/deserializer (SerDes) chips, positioned around the switch SOC, wherein at least two of the plurality of SerDes chips are manufactured by different semiconductor processes, and wherein the core circuit is manufactured by a different semiconductor process than that of at least one of the plurality of SerDes chips; and a plurality of inter-chip interfaces, for connecting the switch SOC to the plurality of SerDes chips, respectively, wherein a first SerDes chip of the plurality of SerDes chips comprises:
a second de-multiplexer, directly connected to the first de-multiplexer via a first inter-chip interface of the plurality of inter-chip interfaces, configured to convert first serial data to first parallel data and send the first parallel data to the switch SOC; and
a second multiplexer, directly connected to the first multiplexer via a second inter-chip interface of the plurality of inter-chip interfaces, configured to convert second parallel data from the switch SOC to second serial data and sending the second serial data to another chip.

2. The multi-chip structure of claim 1, wherein the plurality of SerDes chips comprises at least three SerDes chips positioned at different sides of the switch SOC.

3. The multi-chip structure of claim 1, wherein the plurality of SerDes chips comprises four SerDes chips, and the four SerDes chips are positioned at four sides of the switch SOC, respectively.

4. The multi-chip structure of claim 1, wherein the plurality of SerDes chips supports at least two different standards.

5. The multi-chip structure of claim 4, wherein the at least two different standards comprise a non-return-to-zero (NRZ) standard and a pulse-amplitude modulation (PAM) standard.

6. The multi-chip structure of claim 1, wherein the switch SOC and the plurality of SerDes chips are within a single package.

7. The multi-chip structure of claim 1, wherein the switch SOC and the plurality of SerDes chips are used in a physical network switch.

8. A multi-chip structure, comprising:
a system on chip (SOC) comprising a core circuit, a first multiplexer, and a first de-multiplexer;
at least three serializer/deserializer (SerDes) chips positioned at different sides of the SOC, wherein at least two of the at least three SerDes chips are manufactured by different semiconductor processes, and wherein the core circuit is manufactured by a different semiconductor process than that of at least one of the at least three SerDes chips; and
a plurality of inter-chip interfaces, for connecting the SOC to the at least three SerDes chips, respectively,
wherein a first SerDes chip of the at least three SerDes chips comprises:
a second de-multiplexer, directly connected to the first de-multiplexer via a first inter-chip interface of the plurality of inter-chip interfaces, configured to convert first serial data to first parallel data and send the first parallel data to the switch SOC; and
a second multiplexer, directly connected to the first multiplexer via a second inter-chip interface of the plurality of inter-chip interfaces, configured to convert second parallel data from the switch SOC to second serial data and sending the second serial data to another chip.

9. The multi-chip structure of claim 8, wherein multi-chip structure comprises four SerDes chips, and the four SerDes chips are positioned at four sides of the SOC, respectively.

10. The multi-chip structure of claim 8, wherein the at least three SerDes chips supports at least two different standards.

11. The multi-chip structure of claim 10, wherein the at least two different standards comprise a non-return-to-zero (NRZ) standard and a pulse-amplitude modulation (PAM) standard.

12. The multi-chip structure of claim 8, wherein the SOC and the at least three SerDes chips are within a single package.

13. The multi-chip structure of claim 8, wherein the SOC and the at least three SerDes chips are used in a physical network switch.

14. A multi-chip structure, comprising:
a system on chip (SOC) comprising a core circuit, a first multiplexer, and a first de-multiplexer;
a plurality of input/output (IO) chips, positioned around the SOC, wherein at least two of the plurality of IO chips are manufactured by different semiconductor processes, and wherein the core circuit is manufactured by a different semiconductor process than that of at least one of the plurality of IO chips; and
a plurality of inter-chip interfaces, for connecting the SOC to the plurality of IO chips, respectively,
wherein a first IO chip of the plurality of IO chips comprises:
a second de-multiplexer, directly connected to the first de-multiplexer via a first inter-chip interface of the plurality of inter-chip interfaces, configured to convert first serial data to first parallel data and send the first parallel data to the switch SOC; and
a second multiplexer, directly connected to the first multiplexer via a second inter-chip interface of the plurality of inter-chip interfaces, configured to convert second parallel data from the switch SOC to second serial data and sending the second serial data to another chip.

15. The multi-chip structure of claim 14, wherein the plurality of IO chips comprises four IO chips, and the four IO chips are positioned at four sides of the SOC, respectively.

16. The multi-chip structure of claim 14, wherein the plurality of IO chips supports at least two different standards.

17. The multi-chip structure of claim 1, wherein the different semiconductor processes by which the at least two of the plurality of SerDes chips are manufactured have different supply voltages.

18. The multi-chip structure of claim 8, wherein the different semiconductor processes by which the at least two of the at least three SerDes chips are manufactured have different supply voltages.

19. The multi-chip structure of claim 14, wherein the different semiconductor processes by which the at least two of the plurality of IO chips are manufactured have different supply voltages.

20. The multi-chip structure of claim 4, wherein the at least two different standards comprise at least two different Ethernet standards.

21. The multi-chip structure of claim 10, wherein the at least two different standards comprise at least two different Ethernet standards.

* * * * *